United States Patent
Wang et al.

(10) Patent No.: US 12,439,555 B2
(45) Date of Patent: Oct. 7, 2025

(54) METHOD FOR MANUFACTURING HEAT DISSIPATION STRUCTURE OF ELECTRONIC ELEMENT, HEAT DISSIPATION STRUCTURE, AND ELECTRONIC DEVICE

(71) Applicant: HONOR DEVICE CO., LTD., Shenzhen (CN)

(72) Inventors: Zhiqiang Wang, Shenzhen (CN); Hanghang Dong, Shenzhen (CN); Xiaofeng Hu, Shenzhen (CN); Junjie Yang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/036,273

(22) PCT Filed: Aug. 26, 2022

(86) PCT No.: PCT/CN2022/115230
§ 371 (c)(1),
(2) Date: May 10, 2023

(87) PCT Pub. No.: WO2023/071487
PCT Pub. Date: May 4, 2023

(65) Prior Publication Data
US 2023/0413481 A1    Dec. 21, 2023

(30) Foreign Application Priority Data
Oct. 27, 2021 (CN) .......................... 202111257605.5

(51) Int. Cl.
*H05K 7/20* (2006.01)

(52) U.S. Cl.
CPC ......... *H05K 7/2029* (2013.01); *H05K 7/2039* (2013.01)

(58) Field of Classification Search
CPC .......................... H05K 7/2029; H05K 7/2039
(Continued)

(56) References Cited

U.S. PATENT DOCUMENTS

| 6,054,198 A * | 4/2000 | Bunyan | C09K 5/06 |
| | | | 524/404 |
| 6,286,212 B1 * | 9/2001 | Eaton | C09K 5/063 |
| | | | 165/185 |

(Continued)

FOREIGN PATENT DOCUMENTS

| CN | 203896662 U | 10/2014 |
| CN | 105472941 A | 4/2016 |

(Continued)

*Primary Examiner* — Anatoly Vortman
(74) *Attorney, Agent, or Firm* — WOMBLE BOND DICKINSON (US) LLP

(57) ABSTRACT

This application provides a method for manufacturing a heat dissipation structure of an electronic element, a heat dissipation structure, and an electronic device. The method includes: placing a substrate having an electronic element in an environment that meets a preset temperature condition; and in the environment that meets the preset temperature condition, covering a periphery of the electronic element with a heat dissipation cover, fixedly connecting the heat dissipation cover to the substrate, and placing a solid-state phase-change thermally conductive material in an accommodation cavity surrounded by the substrate and the heat dissipation cover.

20 Claims, 10 Drawing Sheets

(58) Field of Classification Search
USPC .......................................................... 361/700
See application file for complete search history.

(56) References Cited

U.S. PATENT DOCUMENTS

| | | | | |
|---|---|---|---|---|
| 6,391,442 | B1* | 5/2002 | Duvall | F28D 20/02 428/407 |
| 6,451,422 | B1* | 9/2002 | Nguyen | B32B 27/12 428/323 |
| 6,644,395 | B1* | 11/2003 | Bergin | H01L 23/3735 361/705 |
| 6,757,170 | B2* | 6/2004 | Lee | H01L 23/42 165/185 |
| 6,764,759 | B2* | 7/2004 | Duvall | C09K 5/063 428/407 |
| 6,870,736 | B2* | 3/2005 | Lee | H01L 23/42 165/185 |
| 7,347,354 | B2* | 3/2008 | Hurley | B23K 31/02 228/221 |
| 7,535,715 | B2* | 5/2009 | Chung | F28F 13/00 361/708 |
| 8,526,186 | B2* | 9/2013 | Yokoya | H01L 23/49827 174/16.3 |
| 8,587,945 | B1* | 11/2013 | Hartmann | H01L 23/42 361/720 |
| 9,082,743 | B2* | 7/2015 | Hung | H01L 24/73 |
| 9,082,752 | B2 | 7/2015 | Chen et al. | |
| 10,424,527 | B2* | 9/2019 | Sikka | H01L 24/32 |
| 10,764,989 | B1 | 9/2020 | Lui et al. | |
| 10,772,236 | B2 | 9/2020 | Zhang et al. | |
| 2002/0135984 | A1* | 9/2002 | Greenwood | H01L 23/4275 361/720 |
| 2002/0185268 | A1* | 12/2002 | Rauch | H01L 21/4878 165/185 |
| 2003/0051868 | A1* | 3/2003 | Dishongh | F28F 13/00 165/185 |
| 2003/0077478 | A1* | 4/2003 | Dani | H01L 24/29 428/673 |
| 2003/0112603 | A1 | 6/2003 | Roesner et al. | |
| 2003/0160319 | A1* | 8/2003 | Zheng | H01L 23/36 257/E23.101 |
| 2003/0178730 | A1 | 9/2003 | Rumer et al. | |
| 2003/0203181 | A1* | 10/2003 | Ellsworth, Jr. | H01L 23/4275 428/307.3 |
| 2003/0203188 | A1* | 10/2003 | H. | C09K 5/063 428/328 |
| 2004/0017656 | A1* | 1/2004 | Lee | H01L 23/42 174/15.2 |
| 2005/0041406 | A1* | 2/2005 | Matayabas | H01L 24/29 361/784 |
| 2005/0111188 | A1* | 5/2005 | Bhattacharya | H01L 23/427 361/708 |
| 2006/0120051 | A1* | 6/2006 | Macris | H01L 24/32 257/E23.137 |
| 2007/0278667 | A1* | 12/2007 | Kusano | H01L 21/565 257/E23.088 |
| 2012/0182693 | A1* | 7/2012 | Boday | C09K 5/14 252/78.3 |
| 2014/0367847 | A1* | 12/2014 | Strader | H01L 23/42 438/122 |
| 2015/0162307 | A1* | 6/2015 | Chen | H01L 21/56 438/107 |
| 2015/0279761 | A1* | 10/2015 | Bet-Shliemoun | H01L 23/42 257/714 |
| 2016/0094692 | A1 | 3/2016 | Zhang et al. | |
| 2017/0372979 | A1* | 12/2017 | Gandhi | H01L 23/3675 |
| 2019/0148260 | A1* | 5/2019 | Sikka | H01L 23/3675 257/713 |
| 2019/0267253 | A1 | 8/2019 | Stathakis et al. | |
| 2020/0051894 | A1* | 2/2020 | Wan | H01L 23/427 |
| 2022/0344237 | A1 | 10/2022 | Deng et al. | |
| 2023/0093924 | A1* | 3/2023 | Shah | H01L 21/52 257/692 |

FOREIGN PATENT DOCUMENTS

| | | |
|---|---|---|
| CN | 106357847 A | 1/2017 |
| CN | 206196236 U | 5/2017 |
| CN | 107205330 A | 9/2017 |
| CN | 107396592 A | 11/2017 |
| CN | 108777927 A | 11/2018 |
| CN | 110602932 A | 12/2019 |
| CN | 111132520 A | 5/2020 |
| CN | 113113369 A | 7/2021 |
| CN | 214477410 U | 10/2021 |
| CN | 115003102 A | 9/2022 |
| TW | 201351582 A | 12/2013 |
| WO | 2017197846 A1 | 11/2017 |

* cited by examiner

METHOD FOR MANUFACTURING HEAT DISSIPATION STRUCTURE OF ELECTRONIC ELEMENT, HEAT DISSIPATION STRUCTURE, AND ELECTRONIC DEVICE

CROSS-REFERENCE TO RELATED APPLICATIONS

This application is a national stage of International Application No. PCT/CN2022/115230, filed on Aug. 26, 2022, which claims priority to Chinese Patent Application No. 202111257605.5, filed on Oct. 27, 2021. The disclosures of both of the aforementioned applications are hereby incorporated by reference in their entireties.

TECHNICAL FIELD

This application relates to the field of electronic device technologies, and in particular, to a method for manufacturing a heat dissipation structure of an electronic element, a heat dissipation structure, and an electronic device.

BACKGROUND

With the advance of technologies, electronic devices gradually develop toward miniaturization, lightness, and high performance. Integration of electronic elements in an electronic device is increasingly high, and power consumption is also increasingly high. Increasing power consumption of the electronic element causes a large amount of heat in a running process of the electronic element. When the heat causes an excessive temperature of the electronic element, a running speed of the electronic element is affected, and therefore, a problem occurs during running of the electronic device.

A heat dissipation manner of the electronic element is that heat is transmitted to a heat sink in a heat conduction manner by using the heat sink in close contact with the electronic element, and then heat reaching the heat sink is dissipated to the environment by using a fan or the like. Inevitably, there is a gap at a contact surface between the electronic element and the heat sink. Air in the gap is a poor heat conductor, and affects heat transfer to the heat sink. Therefore, the gap needs to be filled with a thermally conductive medium, so that heat conduction is smoother and quicker.

In the conventional technology, a thermally conductive medium that is liquid (for example, a liquid metal heat conductor, usually referred to as liquid metal for short) at a normal temperature (also referred to as a common temperature or an indoor temperature and usually defined as 25° C.) is usually used to fill the foregoing gap. In a thermally conductive medium filling process in a processing step, the liquid thermally conductive medium needs to be injected by using a glue dispenser. In this filling process, a dedicated device such as the glue dispenser needs to be purchased. In addition, to avoid leakage of the liquid thermally conductive medium, process stability of the filling process needs to be high. Therefore, device costs and processing costs in the processing step increase, and production efficiency is affected.

SUMMARY

This application provides a method for manufacturing a heat dissipation structure of an electronic element, a heat dissipation structure, and an electronic device. A thermally conductive material that is in a solid state at a normal temperature is used and is placed between an electronic element and a heat sink. When the electronic element works, the solid-state thermally conductive material melts to a liquid state, to fill a gap between the electronic element and the heat sink and establish a thermally conductive channel between the electronic element and the heat sink. Because the solid-state thermally conductive material is used, a glue dispensing station is not required in a filling process. This simplifies steps and devices in the filling process and reduces processing difficulty, and then improves production efficiency and reduces production and manufacturing costs.

According to a first aspect, this application provides a method for manufacturing a heat dissipation structure of an electronic element, including:
  placing a substrate having an electronic element in an environment that meets a preset temperature condition; and
  in the environment that meets the preset temperature condition, covering a periphery of the electronic element with a heat dissipation cover, fixedly connecting the heat dissipation cover to the substrate, and placing a solid-state phase-change thermally conductive material in an accommodation cavity surrounded by the substrate and the heat dissipation cover.

According to the method for manufacturing a heat dissipation structure of an electronic element in this application, the phase-change thermally conductive material that is in a solid state in the preset temperature condition is selected, and the phase-change thermally conductive material can be directly picked up manually or by using a mechanical hand to perform a filling operation, so that a filling process can be completely free of dependence on a glue dispensing station. In this way, steps and devices in the filling process are simplified, and production and manufacturing costs of the heat dissipation structure are reduced. In addition, because a liquid phase-change thermally conductive material is no longer used, a process control requirement on horizontality and stability of the substrate in the filling process is reduced. In this case, costs of process control software and hardware such as a sensor and a controller on a corresponding production line can be reduced, and production and manufacturing efficiency can be further improved.

In addition, the heat dissipation cover is connected to the substrate and surrounds the electronic element. In this application, the heat dissipation cover has a heat dissipation function and a function of preventing leakage of a melted phase-change thermally conductive material, so that the heat dissipation cover has a "one-cover multiple-use" effect. Production and manufacturing costs of the heat dissipation structure are reduced, and a heat dissipation structure design is optimized. Compared with that in a conventional manner in which a silica gel ring and a foam are used to seal a phase-change thermally conductive material, in a case of a same thickness, the heat dissipation cover provides a larger accommodation cavity, and more phase-change thermally conductive materials can be placed. This is more conducive to lightness development of the electronic device.

In addition, the heat dissipation cover is directly connected to the substrate to form the accommodation cavity. Compared with that in a conventional manner in which a silica gel ring and a foam are pressed on a surface of an electronic element, a risk of pressure damage to the electronic element can be avoided.

Optionally, the electronic element and the substrate may be welded together by using a wire or a contact, or may be connected in an attaching manner.

Optionally, the solid-state phase-change thermally conductive material may be directly picked up and placed manually or by using a mechanical hand.

Optionally, the solid-state phase-change thermally conductive material is placed in the accommodation cavity surrounded by the substrate and the heat dissipation cover. The periphery of the electronic element may be pre-covered with the heat dissipation cover, and then the solid-state phase-change thermally conductive material is placed in the accommodation cavity. Alternatively, an opening may be disposed on a top wall of the heat dissipation cover, the heat dissipation cover covers the periphery of the electronic element and is fixedly connected to the substrate, and then the solid-state phase-change thermally conductive material is placed in the accommodation cavity through the opening.

Optionally, the heat dissipation cover and the substrate may be connected in a manner such as attaching, sticking, welding, bolting, or clamping, to implement a fixed connection between the heat dissipation cover and the substrate.

Optionally, sealing may be performed at a joint between the heat dissipation cover and the substrate, and a sealing adhesive is applied or a sealing ring is pressed at the joint between the heat dissipation cover and the substrate.

Optionally, a manner of attaching a heat dissipation module and the heat dissipation cover is as follows: A bottom area of the heat dissipation module is set to be greater than an area of the top wall of the heat dissipation cover, a periphery of the heat dissipation module is bolted to the substrate, and a middle part of the heat dissipation module is pressed onto the heat dissipation cover. Alternatively, the heat dissipation module is directly attached to the heat dissipation cover in a manner such as sticking, welding, or bolting.

A purpose of adding the heat dissipation module is as follows: Compared with a separate heat dissipation cover, the added heat dissipation module can provide more diversified technical solutions for fast heat dissipation. For example, when the electronic device is a mobile phone, the heat dissipation module is a metal support part of a battery or a screen, and heat can be quickly exported from the inside of the mobile phone to the outside and emitted to the environment.

In a possible design, the covering a periphery of the electronic element with a heat dissipation cover, fixedly connecting the heat dissipation cover to the substrate, and placing a solid-state phase-change thermally conductive material in an accommodation cavity surrounded by the substrate and the heat dissipation cover includes:

after the phase-change thermally conductive material is constructed into a sheet-like structure, sticking the sheet-like structure to an inner surface of a top wall of the heat dissipation cover, to form an integrated structure; and covering the periphery of the electronic element with the integrated structure, and fixedly connecting the integrated structure to the substrate.

The phase-change thermally conductive material and the heat dissipation cover form the integrated structure. When the electronic element is covered, the phase-change thermally conductive material does not need to be placed separately, so that an operation such as positioning or adjustment required when the phase-change thermally conductive material is placed in the accommodation cavity is avoided, thereby further reducing process control difficulty and improving production efficiency.

In a possible design, an opening is disposed on the top wall, an avoidance hole is disposed on the sheet-like structure, and the manufacturing method further includes:

attaching a heat dissipation module to the top wall, and enabling a protruding thermally conductive column on an outer wall of the heat dissipation module to sequentially pass through the opening and the avoidance hole and extend into the accommodation cavity. The heat dissipation module is directly in contact with the phase-change thermally conductive material by using the thermally conductive column, so that a spacing between the electronic element and the heat dissipation module can be smaller. This reduces a length of a heat transfer path, reduces heat transfer resistance, and facilitates an ultra-thin design of the electronic device.

Optionally, a manner of constructing the phase-change thermally conductive material into the sheet-like structure may be mechanical pressing, pouring after heating and melting, or the like.

Optionally, the phase-change thermally conductive material of the sheet-like structure may be sticked to the inner surface of the top wall of the heat dissipation cover by using a hot melt adhesive or another adhesive.

Optionally, a production manner of the heat dissipation cover may be metal stamping.

When stamping is performed on the heat dissipation cover, and the phase-change thermally conductive material is constructed into a sheet, the opening is directly disposed on the heat dissipation cover, the avoidance hole is disposed on the sheet-like phase-change thermally conductive material, and the opening and the avoidance hole should be disposed directly opposite each other. Then, the heat dissipation cover is sticked to the phase-change thermally conductive material.

Optionally, after the heat dissipation cover and the phase-change thermally conductive material are sticked into an integrated structure, a hole may be disposed on the integrated structure, to synchronously form the opening and the avoidance hole that are disposed directly opposite each other.

In a possible design, the preset temperature condition is 15~30° C. An average annual indoor temperature in most regions can meet the preset temperature condition. Therefore, the manufacturing method is widely used.

In a possible design, a melting point of the phase-change thermally conductive material is 35~65° C.

Optionally, the foregoing phase-change thermally conductive material may be an organic phase-change material, an inorganic phase-change material, or a composite phase-change material.

Specifically, paraffin or fatty acid may be used as the organic phase-change material.

Specifically, the inorganic phase-change material may be a paraffin/graphene composite phase-change material. Organic paraffin is used as a phase-change material, and expanded graphite is used as a support structure, to form the composite phase-change material.

Specifically, the inorganic phase-change material may be crystalline hydrated salt, molten salt, a metal material, or another inorganic substance.

In a possible design, the phase-change thermally conductive material is a metal material.

In a possible design, the phase-change thermally conductive material includes a gallium-based alloy, an indium-based alloy, or a bismuth-based alloy.

For example, the gallium-based alloy may be a gallium-indium alloy, a gallium-lead alloy, a gallium-mercury alloy, a gallium-indium-tin alloy, or a gallium-indium-tin-zinc alloy.

For example, the indium-based alloy may be an indium-bismuth-copper alloy or an indium-bismuth-tin alloy.

For example, the bismuth-based alloy may be a bismuth-tin alloy.

In a possible design, the heat dissipation cover is a metal cover. The metal cover has a good heat conduction effect and a good shielding effect. In addition, when the heat dissipation cover is the metal cover, pick-up and transfer may be performed by using a magnetic mechanical arm. This facilitates an operation in an assembly step.

Optionally, a material of the heat dissipation cover is stainless steel, a copper-nickel-zinc alloy, a magnesium-aluminum alloy, or the like.

In a possible design, the heat dissipation module has a heat dissipation fin or a heat dissipation grille. This can increase a heat exchange area with air, and improve heat dissipation efficiency.

According to a second aspect, this application further provides a heat dissipation structure of an electronic element, including:
  a substrate, provided with an electronic element;
  a heat dissipation cover, connected to the substrate and surrounding the electronic element, where the heat dissipation cover and the substrate form an accommodation cavity that accommodates the electronic element; and
  a phase-change thermally conductive material, disposed in the accommodation cavity, where a melting point of the phase-change thermally conductive material is 35~65° C.

In the heat dissipation structure of the electronic element provided in this application, the phase-change thermally conductive material whose melting point is 35~65° C. is selected. A melting point temperature of the phase-change thermally conductive material is higher than 25° C. that is a normal temperature. Therefore, the phase-change thermally conductive material is in a solid state at the normal temperature, and can be directly picked up manually or by using a mechanical hand to perform a filling operation, so that a filling process can be free of dependence on a glue dispensing station. In this way, steps and devices in the filling process are simplified, and production and manufacturing costs of the heat dissipation structure are reduced.

Optionally, anti-seepage glue is applied to an inner surface of a peripheral wall and an inner surface of a top wall that are of the heat dissipation cover and an upper surface of the electronic element, that is, positions in contact with the phase-change thermally conductive material.

A size of the accommodation cavity formed between the heat dissipation cover and the substrate may be determined according to a size of the substrate. When a large accommodation cavity is needed, a substrate with a large size may be disposed. Alternatively, a size of the accommodation cavity may be determined according to power consumption of the electronic element. When power consumption of the electronic element is relatively high, the accommodation cavity 60 may be relatively large, to accommodate more phase-change thermally conductive materials.

In addition, for the electronic device, the electronic element may be disposed on the substrate, and a size of the substrate may be determined according to a size of the electronic device and a heat dissipation performance requirement.

Optionally, the phase-change thermally conductive material and the heat dissipation cover may be separate structures that are not connected.

In a possible design, the heat dissipation structure further includes a heat dissipation module attached to a top wall of the heat dissipation cover.

Optionally, the heat dissipation cover may be in a ring shape, and surrounds the electronic element in a structure similar to a dam, the top of the heat dissipation cover is open, and the heat dissipation module covers the opening of the heat dissipation cover.

In a possible design, an opening is disposed on the top wall, a thermally conductive column protrudes from an outer wall of the heat dissipation module, and the thermally conductive column passes through the opening and extends into the accommodation cavity.

Optionally, sealing may be performed at an insertion position between the thermally conductive column and the opening, or sealing may not be performed. This may be selected according to different application scenarios.

Optionally, only one thermally conductive column may be disposed, that is, a large round-table structure. In this case, a corresponding opening is a large round hole, and the round table passes through the round hole and extends into the accommodation cavity.

In a possible design, there are a plurality of thermally conductive columns spaced from each other, and the plurality of thermally conductive columns pass through a plurality of openings in a one-to-one correspondence and extend into the accommodation cavity.

In a possible design, the phase-change thermally conductive material is a metal material.

In a possible design, the phase-change thermally conductive material includes a gallium-based alloy, an indium-based alloy, or a bismuth-based alloy.

In a possible design, the heat dissipation cover is a metal cover.

In a possible design, the heat dissipation module has a heat dissipation fin or a heat dissipation grille.

In a possible design, a plurality of electronic elements are disposed on the substrate, and the heat dissipation cover surrounds the plurality of electronic elements. A single heat dissipation cover is corresponding to a plurality of electronic elements, so that costs of a production process and a mounting process of the heat dissipation cover can be reduced, thereby reducing manufacturing costs of the heat dissipation structure in this application.

In a possible design, a melting point of the phase-change thermally conductive material is 50~60° C. During actual production and application, it is found that the melting point should not be too low or too high. If the melting point is too low, the phase-change thermally conductive material is easy to liquefy and inconvenient to assemble. Therefore, strict temperature control is needed for an assembly environment, and this increases production and manufacturing costs. If the melting point is too high, the phase-change thermally conductive material cannot liquefy easily, and this affects heat conduction. If the electronic element works at a temperature close to the melting point for a long time, functional damage of the electronic element is caused, and a service life of the electronic element is reduced.

According to a third aspect, this application further provides an electronic device, including the foregoing heat dissipation structure.

Optionally, the electronic device is any one of a desktop computer, a notebook computer, a tablet computer, a game console, a mobile phone, an electronic watch, a router, a set-top box, a television, and a modem.

Figure 1:
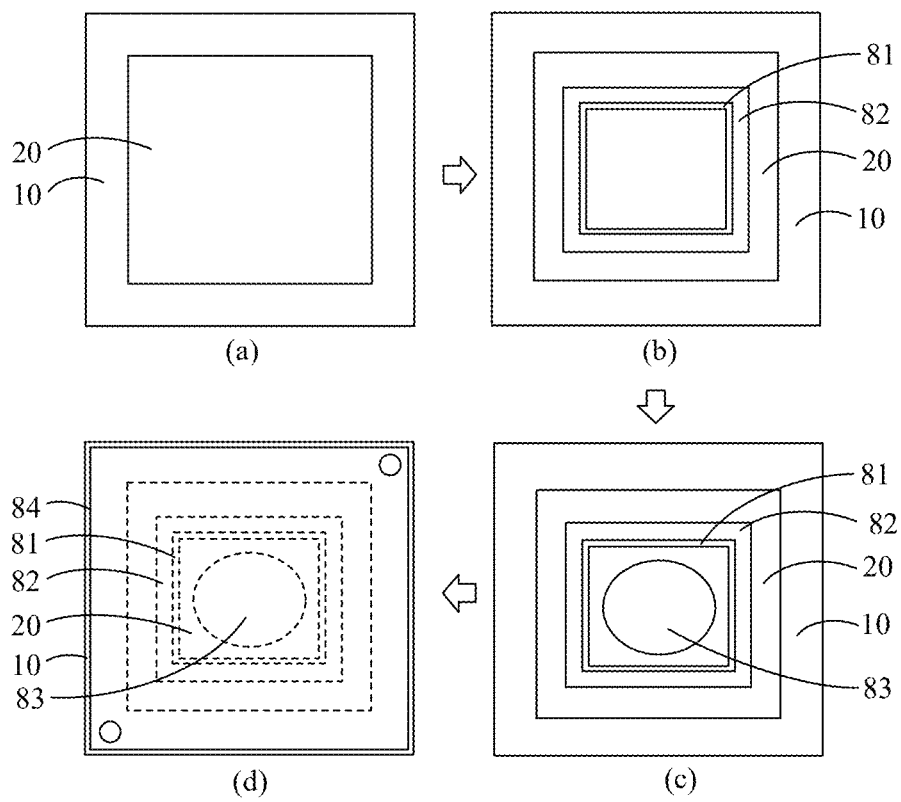
FIG. 1 is a schematic diagram of a method for manufacturing a heat dissipation structure of an electronic element in the conventional technology.

Reference numerals: 10. substrate; 20. electronic element; 30. heat dissipation cover; 31. opening; 40. heat dissipation module; 41. thermally conductive column; 42. heat dissipation grille; 50. phase-change thermally conductive material; 51. avoidance hole; 60. accommodation cavity; 70. electronic device; 81. silica gel ring; 82. foam; 83. liquid metal; 84. heat sink; 100. heat dissipation structure.

DESCRIPTION OF EMBODIMENTS

The following describes the technical solutions in this application with reference to the accompanying drawings. It is clear that the described embodiments are merely some but not all of embodiments of this application.

In the descriptions of this application, it should be noted that, unless otherwise specified and limited, the terms "mount", "connection", and "connect" should be understood in a broad sense, for example, may indicate a fixed connection, a detachable connection, an integral connection, a mechanical connection, an electrical connection, mutual communication, a direct connection, an indirect connection through an intermediate medium, an internal connection between two elements, or an interaction relationship between two elements. A person of ordinary skill in the art may understand a specific meaning of the foregoing term in this application according to a specific situation.

In the descriptions of this application, it should be understood that an orientation relationship or a position relationship indicated by terms "up", "down", "side", "in", "out", "top", and "bottom" are an orientation relationship or a position relationship based on mounting, and is merely for ease of description and simplification of this application, but is not intended to indicate or imply that a specified apparatus or element necessarily has a specific orientation or is constructed and operated in a specific orientation. Therefore, the terms should not be construed as a limitation on this application.

It should be further noted that in embodiments of this application, a same reference numeral indicates a same part or a same component. For a same component or part in embodiments of this application, only one component or part may be marked with a reference numeral in the figure as an example. It should be understood that, for another same component or part, the reference numeral is also applicable.

In the descriptions of this application, it should be noted that the term "and/or" is merely an association relationship for describing associated objects, and indicates that three relationships may exist. For example, A and/or B may indicate the following three cases: Only A exists, both A and B exist, and only B exists.

An electronic element is a basic element in an electronic circuit, and has two or more leads or metal contacts. After being connected to each other, electronic elements may constitute an electronic circuit with a specific function. A common manner of connecting the electronic elements is welding onto a substrate. The electronic element may be an individual package, such as a resistor, a capacitor, an inductor, a transistor, or a diode, or may be various groups with different complexity, such as an integrated circuit (Integrated Circuit, IC).

An electronic device is a device that includes a plurality of types of electronic elements such as an integrated circuit, a transistor, and an electronic tube and functions by using electronic technology software, for example, a desktop computer, a notebook computer, a tablet computer, a game console, a mobile phone, an electronic watch, a router, a set-top box, a television, or a modem.

When the electronic device works, heat is generated, causing a rapid increase in an internal temperature of the device. A direct reason is power consumption of the electronic element. All electronic elements have power consumption of different degrees, and heating intensity of the electronic element changes with power consumption. If the heat is not dissipated in a timely manner, the electronic element continuously heats up, and finally fails due to overheating, resulting in reduced functional stability of the electronic device and even a complete failure of a function. In addition, as the electronic device gradually develops toward miniaturization, lightness, and high performance, integration of electronic elements in the electronic device is also increasingly high, and power consumption is increasingly high. How to rapidly and effectively emit heat generated by the electronic element is a key problem to be resolved for the electronic device developing toward miniaturization, lightness, and high performance.

Currently, a heat dissipation manner of the electronic element is that heat is transmitted to a heat sink in a heat conduction manner by using the heat sink in close contact with the electronic element, and then heat reaching the heat sink is dissipated to the environment by using a fan or the like. On a contact surface between the electronic element and the heat sink, it seems that the contact is good, but actually, an area of direct contact is small, and the remaining part is a gap. Thermal resistance of gas in the gap (the thermal resistance refers to resistance of heat on a heat flow path, and reflects a heat transfer capability of a medium or between media) is relatively large, and a heat conduction capability is extremely weak. This greatly impedes heat transfer from the electronic element to the heat sink. Therefore, the gap needs to be filled with a thermally conductive medium, so that heat conduction is smoother and quicker.

In the conventional technology, a thermally conductive medium that is in a liquid state at a normal temperature is usually used to fill the gap, for example, liquid metal. Therefore, during processing of a heat dissipation structure of the electronic element, a glue dispensing station needs to be added in a filling process to put the liquid thermally conductive medium.

Figure 2:
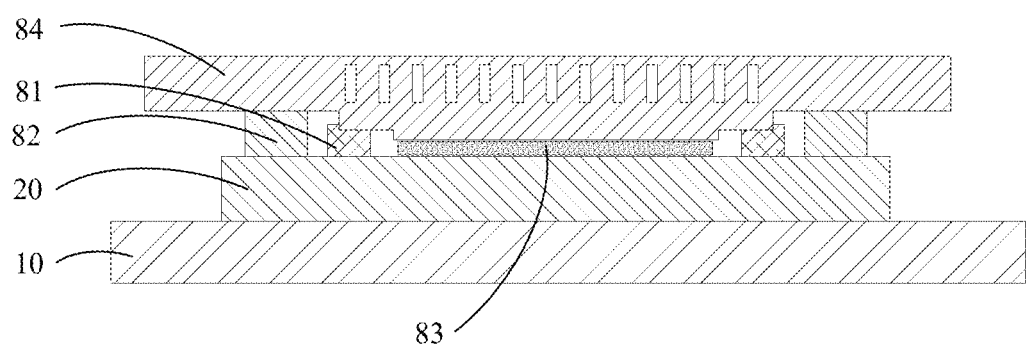
FIG. 2 is a cross-sectional view of (d) in FIG. 1.

FIG. 1 is a schematic diagram of a method for manufacturing a heat dissipation structure of an electronic element 20 in the conventional technology. (a) in FIG. 1 is a schematic diagram in which the electronic element 20 is on a substrate 10 and is not processed, (b) in FIG. 1 is a schematic diagram in which a silica gel ring 81 and a foam 82 are mounted on the electronic element 20, (c) in FIG. 1 is a schematic diagram in which a liquid thermally conductive medium is dispensed, and (d) in FIG. 1 is a schematic diagram in which a heat sink 84 is pressed on a surface of the electronic element 20. FIG. 2 is a cross-sectional view of a heat dissipation structure of the electronic element 20 in the conventional technology, that is, a cross-sectional view of (d) in FIG. 1.

For example, liquid metal 83 is used for filling. A process step of placing the liquid metal 83 between the electronic element 20 and the heat sink 84 is as follows: In a first step, as shown in (a) and (b) in FIG. 1, the silica gel ring 81 and the foam 82 are mounted on the surface of the electronic element 20 disposed on the substrate 10. In a second step, as shown in (c) in FIG. 1, the liquid metal 83 is dispensed on the surface of the electronic element 20 and in an enclosure ring of the silica gel ring 81 and the foam 82 by using a glue dispensing station. In a third step, as shown in (d) in FIG. 1 and FIG. 2, the metal heat sink 84 is pressed over the silica gel ring 81 and the foam 82, and the liquid metal 83 is sealed in space surrounded by the silica gel ring 81, the electronic element 20, and the heat sink 84.

When the liquid metal 83 is dispensed in the second step, there are two manners: One is a two-step manner. The electronic element 20 is first brushed with the liquid metal 83 by using a silica gel brush, then the liquid metal 83 is injected by using a needle tube, and liquid drops are naturally spread on the surface of the electronic element 20. The other is to directly perform glue dispensing in a specified region by using a glue dispenser.

In actual production, it is found that using the liquid metal 83 as a thermally conductive medium to manufacture the heat dissipation structure has the following problems. First, a glue dispensing station needs to be added, and therefore, a corresponding device needs to be purchased and a process is prolonged, resulting in a complex process route and high costs. Second, the liquid metal 83 has relatively high weight and fluidity. If horizontality and stability of the substrate 10 cannot be ensured during glue dispensing, the liquid metal 83 is prone to overflow. To ensure that the liquid metal 83 does not overflow during glue dispensing, only semi-automatic filling can be implemented at present. Therefore, the existing process not only requires relatively high process stability, but also causes a decrease in production efficiency. Third, it is difficult to control the process. Specifically, when the metal heat sink 84 is pressed, to ensure sealing of the heat dissipation structure and prevent leakage of the liquid metal 83, a relatively large pressing force is required. In this case, the electronic element 20 is at a risk of failure. If the pressing force is relatively small, sealing of the heat dissipation structure cannot be ensured. Therefore, the pressing force needs to be accurately controlled.

In conclusion, the existing heat dissipation structure of the electronic element 20 and the existing method for manufacturing the heat dissipation structure are characterized by a complex process route and a high requirement for process stability and control. Therefore, manufacturing costs of the heat dissipation structure of the electronic element 20 are high, and production efficiency is low.

To resolve the foregoing technical problem, this application provides a method for manufacturing a heat dissipation structure of an electronic element 20, a heat dissipation structure, and an electronic device. A thermally conductive material that is in a solid state at a normal temperature is used and is placed between the electronic element 20 and a heat sink 84. When the electronic element 20 works, the solid-state thermally conductive material melts to a liquid state, to fill a gap between the electronic element 20 and the heat sink 84 and establish a thermally conductive channel between the electronic element 20 and the heat sink 84. Because the solid-state thermally conductive material is used, a glue dispensing station is not required in a filling process. This simplifies steps and devices in the filling process and reduces processing difficulty, and then improves production efficiency and reduces production and manufacturing costs.

Figure 3:
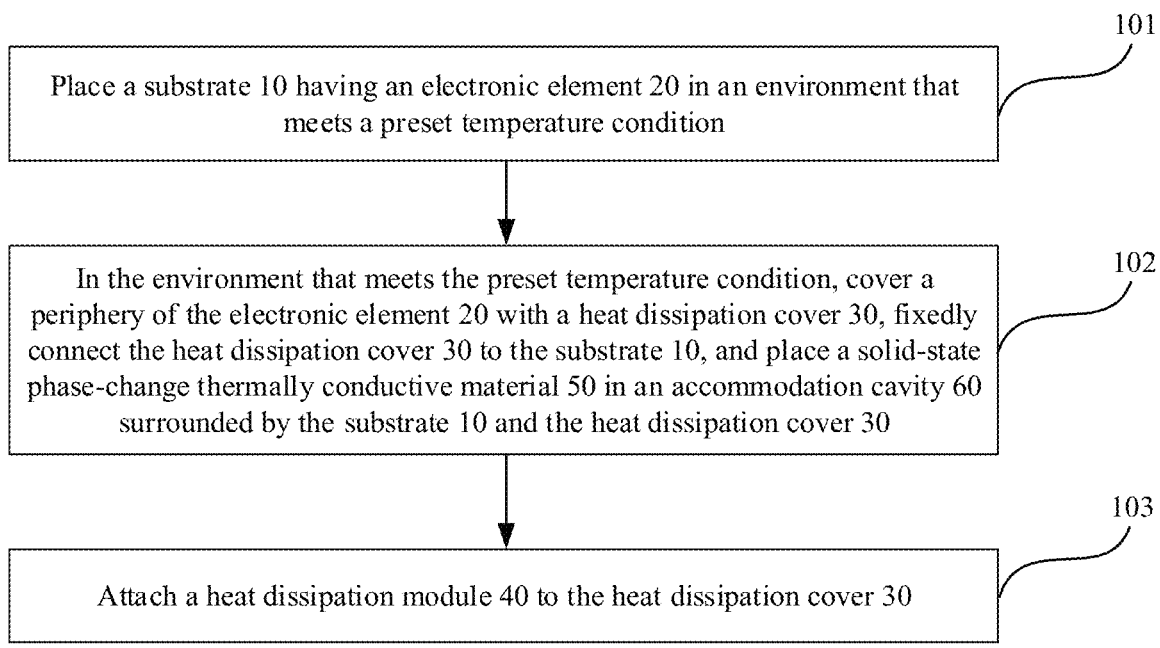
FIG. 3 is a flowchart of a method for manufacturing a heat dissipation structure of an electronic element according to an embodiment of this application.

An embodiment of this application provides a method for manufacturing a heat dissipation structure of an electronic element 20. FIG. 3 is a flowchart of a method for manufacturing a heat dissipation structure of an electronic element 20 according to an embodiment of this application. As shown in FIG. 3, the manufacturing method includes the following steps.

Step 101: Place a substrate 10 having the electronic element 20 in an environment that meets a preset temperature condition.

Step 102: In the environment that meets the preset temperature condition, cover a periphery of the electronic element 20 with a heat dissipation cover 30, fixedly connect the heat dissipation cover 30 to the substrate 10, and place a solid-state phase change thermally conductive material 50 in an accommodation cavity 60 surrounded by the substrate 10 and the heat dissipation cover 30.

According to the method for manufacturing a heat dissipation structure of an electronic element 20 in this embodiment of this application, the phase-change thermally conductive material 50 that is in a solid state in the preset temperature condition is selected, and the phase-change thermally conductive material 50 can be directly picked up manually or by using a mechanical hand to perform a filling operation, so that a filling process can be completely free of dependence on a glue dispensing station. In this way, steps and devices in the filling process are simplified, and production and manufacturing costs of the heat dissipation structure are reduced. In addition, because a liquid phase-change thermally conductive material 50 is no longer used, a process control requirement on horizontality and stability of the substrate 10 in the filling process is reduced. In this case, costs of process control software and hardware such as a sensor and a controller on a corresponding production line can be reduced, and production and manufacturing efficiency can be further improved.

In addition, the heat dissipation cover 30 is connected to the substrate 10 and surrounds the electronic element 20. In this application, the heat dissipation cover has a heat dissipation function and a function of preventing leakage of a melted phase-change thermally conductive material 50, so that the heat dissipation cover 30 has a "one-cover multiple-use" effect. Production and manufacturing costs of the heat dissipation structure are reduced, and a heat dissipation structure design is optimized. Compared with that in a conventional manner in which a silica gel ring 81 and a foam 82 are used to seal a phase-change thermally conductive material 50, in a case of a same thickness, the heat dissipation cover 30 provides a larger accommodation cavity 60, and more phase-change thermally conductive materials 50 can be placed. This is more conducive to lightness development of the electronic device.

In addition, the heat dissipation cover 30 is directly connected to the substrate 10 to form the accommodation cavity 60. Compared with that in a conventional manner in which a silica gel ring 81 and a foam 82 are pressed on a surface of an electronic element 20, a risk of pressure damage to the electronic element 20 can be avoided.

Optionally, the electronic element 20 and the substrate 10 may be welded together by using a wire or a contact, or may be connected in an attaching manner, thereby implementing integration of the electronic element 20 and the substrate 10.

Optionally, the solid-state phase-change thermally conductive material 50 may be directly picked up and placed manually or by using a mechanical hand.

Optionally, the solid-state phase-change thermally conductive material 50 may be placed, in a plurality of manners, in the accommodation cavity 60 surrounded by the substrate 10 and the heat dissipation cover 30. For example, in manner 1, the periphery of the electronic element is pre-covered with the heat dissipation cover 30, then the solid-state phase-change thermally conductive material 50 is placed in the accommodation cavity 60, and finally the heat dissipation cover 30 is fixedly connected to the substrate 10. In manner 2, an opening 31 is disposed on a top wall of the heat dissipation cover 30, the heat dissipation cover 30 covers the periphery of the electronic element 20 and is fixedly connected to the substrate 10, then the solid-state phase-change thermally conductive material 50 is placed in the accommodation cavity 60 through the opening 31, and finally the opening 31 is sealed. In manner 3, the solid-state phase-change thermally conductive material 50 may be integrated inside the heat dissipation cover 30, to form an integrated structure, and then the heat dissipation cover 30 is used for covering and is fixedly connected to the substrate 10. In this case, the solid-state phase-change thermally conductive material 50 is already disposed in the accommodation cavity 60.

Optionally, the heat dissipation cover 30 and the substrate 10 may be connected in a manner such as attaching, sticking, welding, bolting, or clamping, to implement a fixed connection between the heat dissipation cover 30 and the substrate 10. The heat dissipation cover 30 fastened to the substrate 10 is disposed around the periphery of the electronic element 20.

Optionally, sealing may be performed at a joint between the heat dissipation cover 30 and the substrate 10, for example, a sealing adhesive is applied or a sealing ring is pressed at the joint between the heat dissipation cover 30 and the substrate 10, to prevent leakage of the phase-change thermally conductive material 50.

Optionally, to improve a heat dissipation effect of the heat dissipation cover 30, a heat dissipation fin structure, a heat dissipation bump structure, a heat dissipation wave structure, or the like may be disposed on an outer surface of the heat dissipation cover 30, to increase a heat exchange area on the outer surface of the heat dissipation cover 30, and then quickly emit heat from the electronic element 20 to the environment. Alternatively, a fan is added to the outside of the heat dissipation cover 30, and an airflow direction of the fan faces the heat dissipation cover 30. Heat from the electronic element 20 is quickly removed from the heat dissipation cover 30 in an air cooling manner.

As shown in FIG. 3, in the manufacturing method in this embodiment of this application, step 103 may be further added to attach a heat dissipation module 40 to the heat dissipation cover 30.

A purpose of adding the heat dissipation module 40 in this embodiment is as follows: Compared with a separate heat dissipation cover 30, the added heat dissipation module 40 can provide more diversified technical solutions for fast heat dissipation. For example, a heat dissipation module 40 including a heat dissipation fin or a heat dissipation grille 42 can provide a larger heat exchange area than the heat dissipation cover 30. The heat dissipation module 40 may further be a metal support of a functional element in the electronic device. For example, when the electronic device is a mobile phone, the heat dissipation module 40 is a metal support part of a battery or a screen, and heat can be rapidly exported from the inside of the mobile phone to the outside and emitted to the environment.

Specifically, a manner of attaching the heat dissipation module 40 and the heat dissipation cover 30 is as follows: A bottom area of the heat dissipation module 40 is set to be greater than an area of the top wall of the heat dissipation cover 30, a periphery of the heat dissipation module 40 is bolted to the substrate 10, and a middle part of the heat dissipation module is pressed onto the heat dissipation cover 30. Alternatively, the heat dissipation module 40 is directly attached to the heat dissipation cover 30 in a manner such as sticking, welding, or bolting.

It should be noted that, in some scenarios, the heat dissipation cover 30 may be disposed separately. After heat of the electronic element 20 is conducted to the heat dissipation cover 30 by using the phase-change thermally conductive material 50, the heat is emitted to the environment by using the heat dissipation cover 30. In some other scenarios, the heat dissipation cover 30 may include the heat dissipation module 40, that is, the heat dissipation cover 30 and the heat dissipation module 40 are an integrated structure. In this case, the top wall of the heat dissipation cover 30 is a bottom wall of the heat dissipation module 40, and heat of the electronic element 20 is transmitted to the heat dissipation module 40 by using the phase-change thermally conductive material 50, and then is emitted to the environment by using the heat dissipation module 40. In some other scenarios, the heat dissipation cover 30 and the heat dissipation module 40 are separated structures, and the top wall of the heat dissipation cover 30 is attached to a bottom wall of the heat dissipation module in a manner such as sticking, welding, or bolting. In this case, heat of the electronic element 20 is conducted to the heat dissipation cover 30 by using the phase-change thermally conductive material 50, then the heat dissipation cover 30 transfers the heat to the heat dissipation module 40, and the heat is emitted to the environment by using the heat dissipation module 40.

Figure 4:
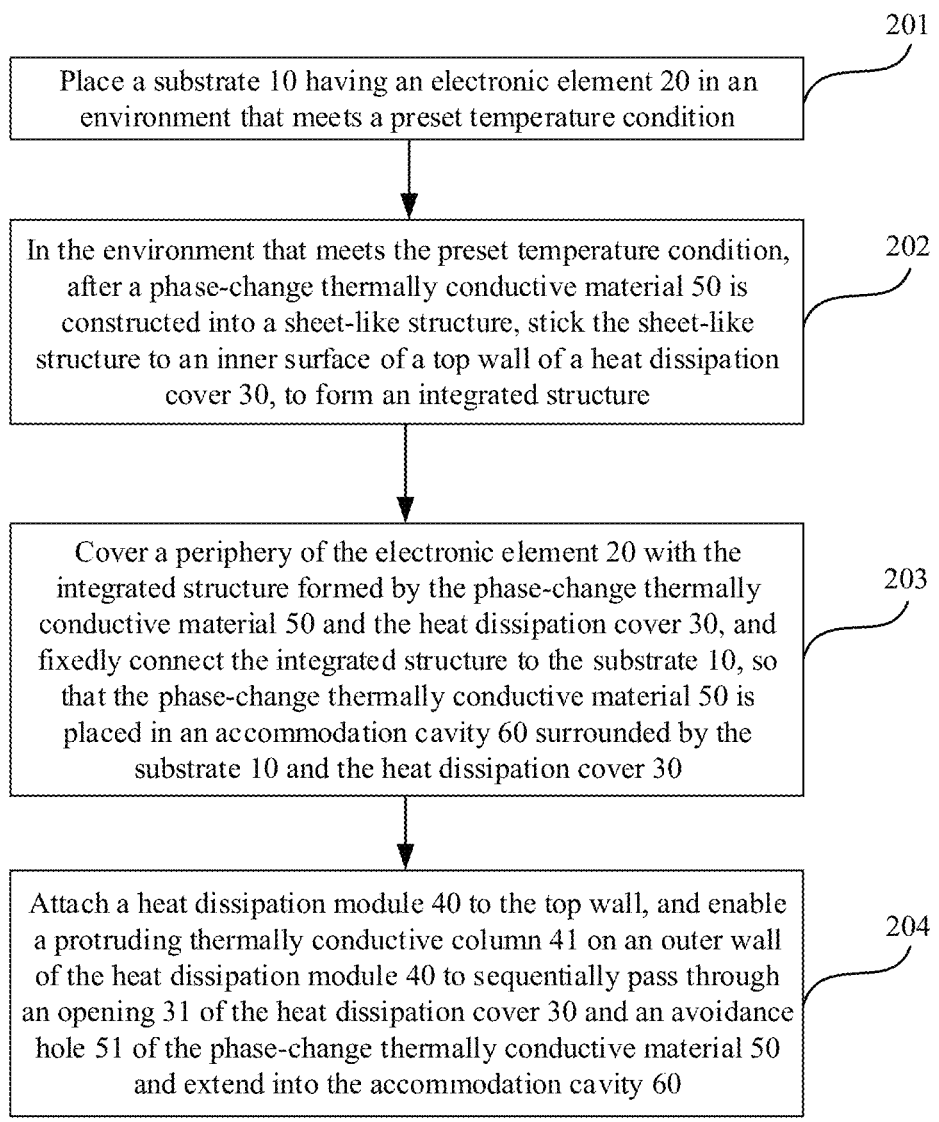
FIG. 4 is a flowchart of another example of a method for manufacturing a heat dissipation structure of an electronic element according to an embodiment of this application.
Figure 5:
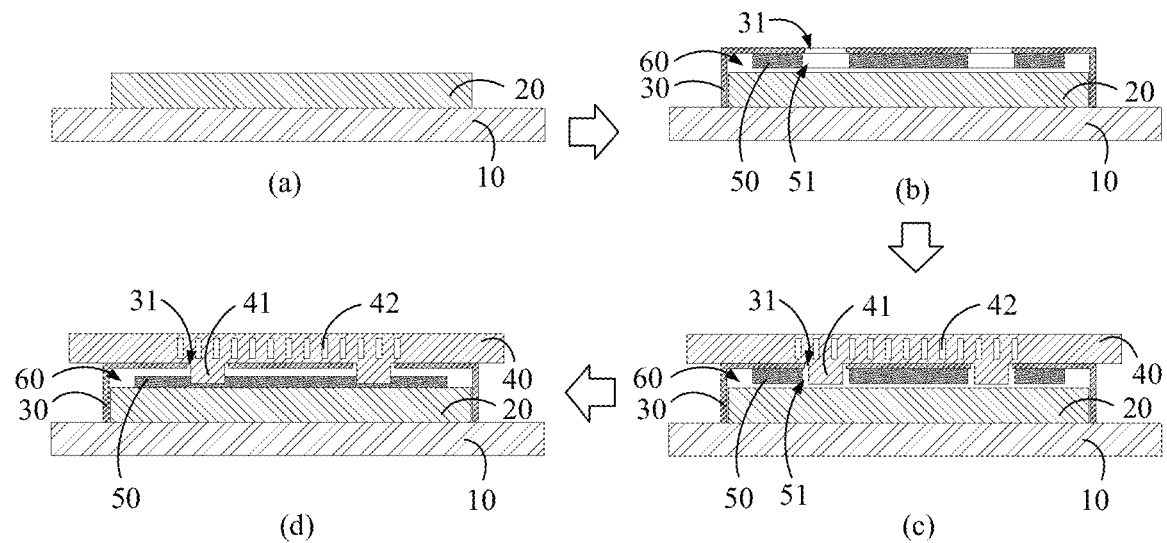
FIG. 5 is a schematic diagram of a method for manufacturing a heat dissipation structure of an electronic element according to an embodiment of this application.

FIG. 4 is a flowchart of another example of a method for manufacturing a heat dissipation structure of an electronic element 20 according to an embodiment of this application. FIG. 5 is a schematic diagram of a method for manufacturing a heat dissipation structure of an electronic element 20 according to an embodiment of this application. (a) in FIG.

5 is a schematic diagram in which the electronic element 20 is on a substrate 10 and is not processed, (b) in FIG. 5 is a schematic diagram in which a periphery of the electronic element 20 is covered with a heat dissipation cover 30 and a phase-change thermally conductive material 50 is placed in an accommodation cavity 60, (c) in FIG. 5 is a schematic diagram in which a heat dissipation module is attached to the heat dissipation cover 30, and (d) in FIG. 5 is a schematic diagram in which the phase-change thermally conductive material 50 is melted when the electronic element 20 is in a working state.

As shown in FIG. 4 and FIG. 5, in another embodiment provided in this application, the manufacturing method includes the following steps.

Step 201: Place a substrate 10 having the electronic element 20 in an environment that meets a preset temperature condition.

Step 202: In the environment that meets the preset temperature condition, after a phase-change thermally conductive material 50 is constructed into a sheet-like structure, stick the sheet-like structure to an inner surface of a top wall of a heat dissipation cover 30, to form an integrated structure.

Step 203: Cover a periphery of the electronic element 20 with the integrated structure formed by the phase-change thermally conductive material 50 and the heat dissipation cover 30, and fixedly connect the integrated structure to the substrate 10, so that the phase-change thermally conductive material 50 is placed in an accommodation cavity 60 surrounded by the substrate 10 and the heat dissipation cover 30.

Step 204: Attach a heat dissipation module 40 to the top wall, and enable a protruding thermally conductive column 41 on an outer wall of the heat dissipation module 40 to sequentially pass through an opening 31 of the heat dissipation cover 30 and an avoidance hole 51 of the phase-change thermally conductive material 50 and extend into the accommodation cavity 60.

In this embodiment, the phase-change thermally conductive material 50 and the heat dissipation cover 30 form the integrated structure. When the electronic element 20 is covered, the phase-change thermally conductive material 50 does not need to be placed separately, so that an operation such as positioning or adjustment required when the phase-change thermally conductive material 50 is placed in the accommodation cavity 60 is avoided, thereby further reducing process control difficulty and improving production efficiency.

In this embodiment, the heat dissipation module 40 is directly in contact with the phase-change thermally conductive material 50 by using the thermally conductive column 41, so that a spacing between the electronic element 20 and the heat dissipation module 40 can be smaller. This reduces a length of a heat transfer path, reduces heat transfer resistance, and facilitates an ultra-thin design of the electronic device.

In addition, the thermally conductive column 41 added to the heat dissipation module passes through the avoidance hole 51 of the phase-change thermally conductive material 50 and extends into the accommodation cavity 60, and after the phase-change thermally conductive material 50 is melted, the phase-change thermally conductive material 50 in a liquid state may be fully wrapped on a bottom wall and a peripheral wall of the thermally conductive column 41, so that the heat dissipation module 40 and the phase-change thermally conductive material 50 have a relatively large contact area for heat exchange, thereby improving heat transfer efficiency.

Optionally, a manner of constructing the phase-change thermally conductive material into the sheet-like structure may be mechanical pressing, pouring after heating and melting, or the like. The phase-change thermally conductive material 50 made into the sheet-like structure may be sticked to the inner surface of the top wall of the heat dissipation cover 30 by using a hot melt adhesive or another adhesive, so that the phase-change thermally conductive material 50 and the heat dissipation cover 30 form an integrated structure, thereby reducing control difficulty in an assembling process.

Optionally, a production manner of the heat dissipation cover 30 may be metal stamping.

When stamping is performed on the heat dissipation cover 30 and the phase-change thermally conductive material 50 is constructed into a sheet, the opening 31 further needs to be disposed on the heat dissipation cover 30, and the avoidance hole 51 needs to be disposed on the sheet-like phase-change thermally conductive material 50. Then, the phase-change thermally conductive material 50 is sticked to the heat dissipation cover 30, and the opening 31 and the avoidance hole 51 should be directly opposite each other after sticking, for the thermally conductive column 41 on the heat dissipation module 40 to pass through in a subsequent step.

Optionally, after the heat dissipation cover 30 and the phase-change thermally conductive material 50 are sticked into an integrated structure, a hole may be disposed on the integrated structure, to synchronously form the opening 31 and the avoidance hole 51 that are disposed directly opposite each other.

The method for manufacturing a heat dissipation structure of an electronic element 20 in this embodiment of this application needs to be performed in the environment that meets the preset temperature condition, so that the phase-change thermally conductive material 50 always keeps a solid state in a manufacturing phase of the heat dissipation structure. The preset temperature condition is 15~30° C., that is, normal temperature ±10° C.

An average annual indoor temperature in most regions can meet the preset temperature condition. Therefore, no air adjustment is required to meet a production condition, production costs can be reduced, and the manufacturing method can be widely used.

In an embodiment, a melting point of the phase-change thermally conductive material is 35~65° C.

A melting point range is higher than a normal temperature, so that the phase-change thermally conductive material 50 can be kept in a solid state indoor, and the phase-change thermally conductive material 50 can be directly picked up manually or by using a mechanical hand to perform a filling operation. In this way, a filling process can be completely free of dependence on a glue dispensing station.

The phase-change thermally conductive material 50 (Phase Change Material, PCM) refers to a substance whose state can be changed when a temperature is unchanged and that can provide latent heat. A process of changing a physical property is referred to as a phase change process. In this case, a large amount of latent heat is absorbed or released by the phase-change material. The phase-change material can absorb or release heat when a phase change occurs, but a temperature of the material does not change or changes slightly. Usually, the phase-change material begins to soften and flow at a temperature of 40~45° C., and is in a solid state at a normal temperature. The phase-change material can be separately used without a reinforcing material. This avoids impact of the reinforcing material on heat conduction performance. Therefore, the phase-change material can freely adjust an internal temperature of a product within a specific temperature range if the external temperature changes. That is, when the external ambient temperature rises, heat can be stored to ensure that an increase in the temperature of the product is small. When the external temperature drops, energy can be released to ensure that a decrease in the temperature of the product is small.

Optionally, the foregoing phase-change thermally conductive material 50 may be an organic phase-change material (organic phase-change materials, OPCMs), an inorganic phase-change material (inorganic phase-change materials, IPCMs), or a composite phase-change material (Composite phase-change materials, CPCMs).

Specifically, in this application, paraffin or fatty acid may be used as the organic phase-change material. Generally, a phase change temperature of a homologous organic substance increases with a carbon chain of the homologous organic substance, so that a series of phase-change materials can be obtained. For example, paraffin is a mixture of solid-state advanced alkane, and a molecular formula of a main component is CnH2n+2, where n=17~35. The main component is straight-chain alkane, and there is a little branched alkane and monocyclic alkane with long side chains. A melting point range of the paraffin is 5.5~65.5° C., that is, some paraffin with long carbon chains is selected to meet the melting point range of the phase-change material required in this application.

Specifically, a composite phase-change material that can be selected in this application includes a paraffin/graphene composite phase-change material. Organic paraffin is used as a phase-change material, and expanded graphite is used as a support structure, to form the composite phase-change material. A melting point range of the composite phase-change material is 53.9~62.6° C., which can meet a condition that a melting point is 35~65° C. in this application. Specifically, an inorganic phase-change material that can be selected in this application includes crystalline hydrated salt, molten salt, a metal material, or another inorganic substance.

In an embodiment, considering that thermal resistance of a metal material is low and a thermal conductivity is large, the phase-change thermally conductive material 50 selected in this embodiment of this application is a metal material.

Optionally, the metal material may be a gallium-based alloy, an indium-based alloy, or a bismuth-based alloy.

For example, the gallium-based alloy may be a gallium-indium alloy, a gallium-lead alloy, a gallium-mercury alloy, a gallium-indium-tin alloy, or a gallium-indium-tin-zinc alloy.

For example, the indium-based alloy may be an indium-bismuth-copper alloy or an indium-bismuth-tin alloy.

For example, the bismuth-based alloy may be a bismuth-tin alloy.

The foregoing metal material mainly includes metal such as bismuth, indium, tin, and gallium. Addition proportions of different metal are adjusted to obtain metal alloys with different melting points, which may be used as the phase-change thermally conductive material 50 in this application. In metal alloys obtained by adding different metal, a metal alloy whose melting point range is 40~60° C. needs to be selected.

In this application, the gallium-indium alloy is preferably used as the phase-change thermally conductive material 50. Thermally conductive performance of the gallium-indium alloy is more than 10 times that of a conventional thermally conductive paste. In addition, the gallium-indium alloy has advantages such as non-volatility, a long service life, stable physical and chemical properties, reliable use, and non-toxic.

It should be noted that, in this application, a metal material in a solid state at a normal temperature is used as the phase-change thermally conductive material 50, and a heat conductivity of the metal material can reach 40~80 W/(m*K). However, a use temperature needs to be greater than a phase-change temperature (that is, a melting point temperature) of the metal material. An optimal heat conduction effect can be achieved only when it is ensured that the metal material is in a liquid state. If the use temperature cannot reach the phase-change temperature, that is, the metal material is still in a solid state, a gap between the electronic element 20 and the heat dissipation cover 30 or between the electronic element 20 and the heat dissipation module 40 cannot be filled, and there is a large amount of air. In this case, heat generated by the electronic element 20 cannot be transmitted to the heat dissipation cover 30 or the heat dissipation module by using the metal material. Therefore, a heat conduction effect is extremely poor.

In an embodiment, the heat dissipation cover 30 is a metal cover.

Considering a heat conduction effect and a shielding effect of the heat dissipation cover the heat dissipation cover 30 is a metal cover, such as stainless steel, a copper-nickel-zinc alloy, or a magnesium-aluminum alloy. This is not limited in this application.

In addition, when the heat dissipation cover 30 is the metal cover, pick-up and transfer may be performed by using a magnetic mechanical arm. This facilitates an operation in an assembly step.

As shown in (c) in FIG. 5, in an embodiment, the heat dissipation module 40 has a heat dissipation fin or heat dissipation grille 42.

The heat dissipation module 40 with the heat dissipation fin or heat dissipation grille 42 can increase a heat exchange area with the air, and improve heat dissipation efficiency.

Figure 6:
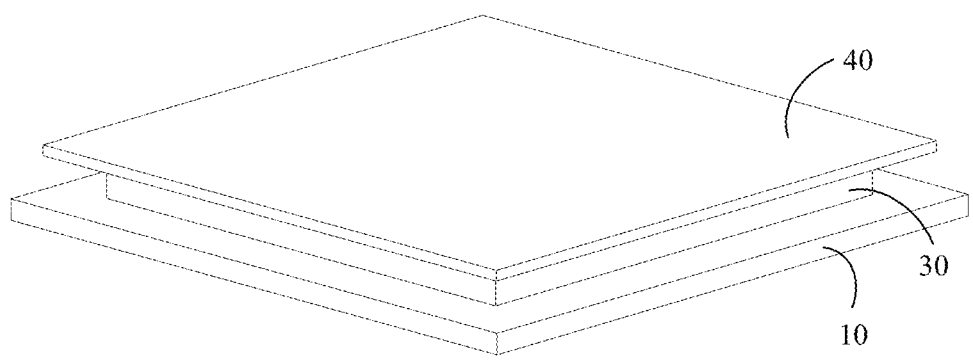
FIG. 6 is an assembly diagram of a heat dissipation structure of an electronic element according to an embodiment of this application.
Figure 7:
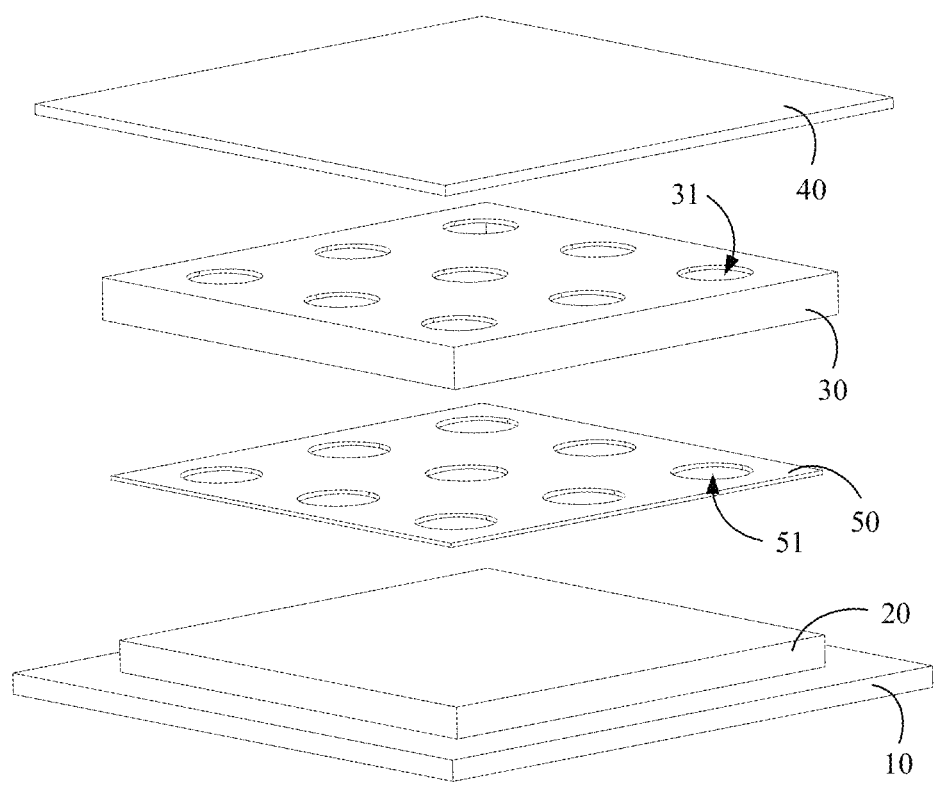
FIG. 7 is an exploded view of FIG. 6.
Figure 8:
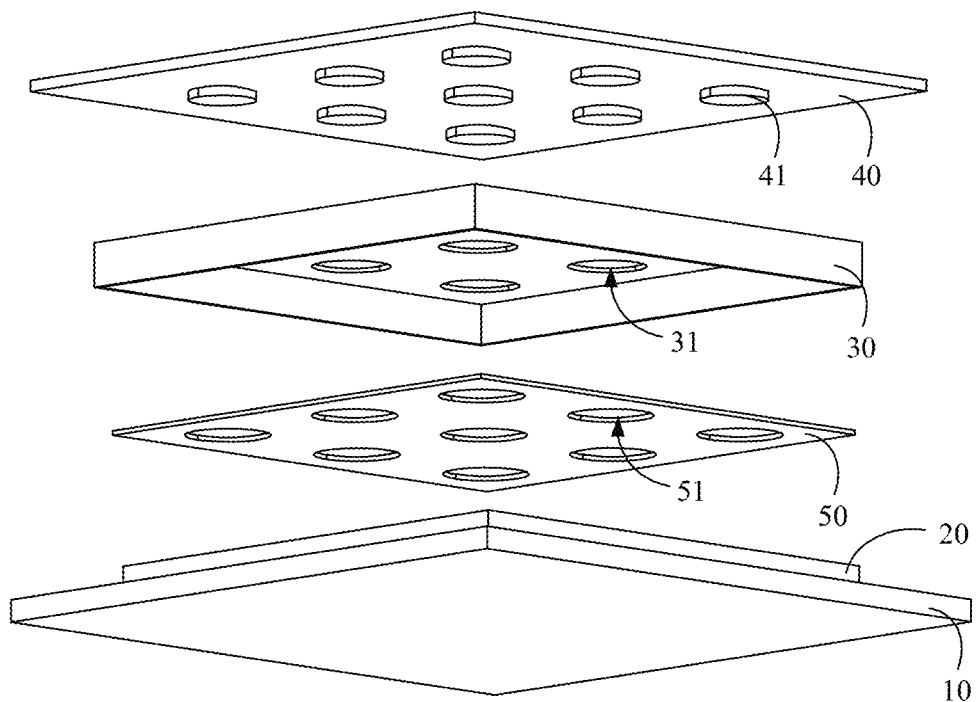
FIG. 8 is a schematic diagram of another angle of view of FIG. 7.

According to a second aspect, an embodiment of this application further provides a heat dissipation structure of an electronic element 20. FIG. 6 is an assembly diagram of a heat dissipation structure of the electronic element 20 according to an embodiment of this application. FIG. 7 is an exploded view of FIG. 6. FIG. 8 is a schematic diagram of another angle of view of FIG. 7.

As shown in FIG. 5 to FIG. 8, the heat dissipation structure includes a substrate 10, a heat dissipation cover 30, and a phase-change thermally conductive material 50.

The substrate 10 is provided with the electronic element 20.

The heat dissipation cover 30 is connected to the substrate 10 and surrounds the electronic element 20, and the heat dissipation cover 30 and the substrate 10 form an accommodation cavity 60 that accommodates the electronic element 20.

The phase-change thermally conductive material 50 is disposed in the accommodation cavity 60, and a melting point of the phase-change thermally conductive material 50 is 35~65° C., which is higher than a normal temperature of 25° C. Therefore, the phase-change thermally conductive material 50 is in a solid state at the normal temperature.

In the heat dissipation structure of the electronic element 20 provided in this embodiment of this application, the phase-change thermally conductive material 50 whose melting point is 35~65° C. is selected. A melting point temperature of the phase-change thermally conductive material 50 is higher than 25° C. that is a normal temperature. Therefore, the phase-change thermally conductive material 50 is in a solid state at the normal temperature, and can be directly picked up manually or by using a mechanical hand to perform a filling operation, so that a filling process can be free of dependence on a glue dispensing station. In this way, steps and devices in the filling process are simplified, and production and manufacturing costs of the heat dissipation structure are reduced.

A specific type of the electronic element 20 is not limited in this application. For example, the electronic element 20 may be a central processing unit (central processing unit, CPU), a graphics processing unit (graphics processing unit, GPU), a universal flash storage (universal flash storage, UFS), a system in package (System in Package, SiP) element, an antenna in package (antenna in package, AiP) element, a system on a chip (system on a chip, SOC) element, a double data rate (double data rate, DDR) memory, a radio frequency integrated circuit (radio frequency integrated circuit, RF IC), a radio frequency power amplifier (radio frequency power amplifier, RF PA), a power management unit (power management unit, PMU), an embedded multimedia card (embedded multimedia card, EMMC), or the like.

A specific type of the substrate 10 is not limited in this application. For example, the substrate 10 may be a printed circuit board (printed circuit board, PCB), a flexible printed circuit (Flexible Printed Circuit, FPC), a double-sided PCB board, a multi-layer PCB board, or the like.

Optionally, to prevent the phase-change thermally conductive material 50 from seeping into a contact surface substrate in contact with the phase-change thermally conductive material 50, anti-seepage glue is applied to an inner surface of a peripheral wall and an inner surface of a top wall that are of the heat dissipation cover 30 and an upper surface of the electronic element 20, that is, positions in contact with the phase-change thermally conductive material 50.

A size of the accommodation cavity 60 formed between the heat dissipation cover 30 and the substrate 10 may be determined according to a size of the substrate 10. For example, when a large accommodation cavity 60 is needed, a substrate 10 with a large size may be disposed. Alternatively, a size of the accommodation cavity 60 may be determined according to power consumption of the electronic element 20. When power consumption of the electronic element 20 is relatively high, a large amount of heat is generated. In this case, the accommodation cavity 60 may be relatively large, to accommodate more phase-change thermally conductive materials 50 and improve a heat transfer rate. When power consumption of the electronic element 20 is relatively low, an amount of heat generated by the electronic element 20 is relatively small. In this case, a small accommodation cavity 60 can also achieve a purpose of heat conduction. In this case, a filling amount of the phase-change thermally conductive material 50 may be reduced, and manufacturing costs of the heat dissipation structure are further reduced.

In addition, for the electronic device, the electronic element 20 may be disposed on the substrate 10. The substrate 10 on which the electronic element 20 is disposed may be disposed in the electronic device. The size of the substrate 10 may be determined according to a size of the electronic device and a heat dissipation performance requirement.

Figure 10:
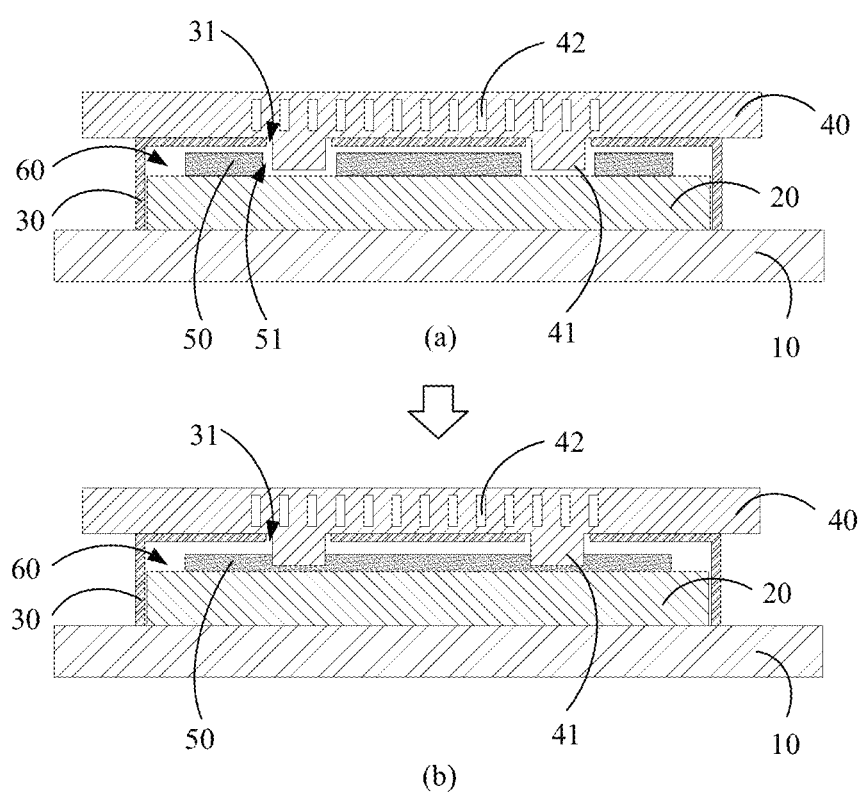
FIG. 10 is a cross-sectional view of another example of a heat dissipation structure of an electronic element according to an embodiment of this application.

FIG. 10 is a cross-sectional view of another example of a heat dissipation structure of an electronic element 20 according to an embodiment of this application. (a) in FIG. 10 is a schematic diagram before the electronic element 20 works, and (b) in FIG. 10 is a schematic diagram in which the phase-change thermally conductive material 50 is melted after the electronic element 20 works. As shown in FIG. 10, optionally, the phase-change thermally conductive material 50 and the heat dissipation cover 30 may be separate structures that are not connected. Before the heat dissipation cover 30 is fixedly connected to the substrate 10, the phase-change thermally conductive material 50 is placed in the accommodation cavity 60.

As shown in FIG. 5 to FIG. 8, in an embodiment, the heat dissipation structure further includes a heat dissipation module 40 attached to a top wall of the heat dissipation cover 30.

The heat dissipation module 40 is added in this embodiment. Compared with a separate heat dissipation cover 30, the added heat dissipation module 40 can provide more diversified technical solutions for fast heat dissipation. For example, a heat dissipation module 40 including a heat dissipation fin or a heat dissipation grille 42 can provide a larger heat exchange area than the heat dissipation cover 30. The heat dissipation module 40 may further be a metal support of a functional element in the electronic device. For example, when the electronic device is a mobile phone, the heat dissipation module 40 is a metal support part of a battery or a screen, and heat can be rapidly exported from the inside of the mobile phone to the outside and emitted to the environment.

Optionally, a manner of attaching the heat dissipation module 40 and the heat dissipation cover 30 is as follows: A bottom area of the heat dissipation module 40 is set to be greater than an area of the top wall of the heat dissipation cover 30, a periphery of the heat dissipation module 40 is bolted to the substrate 10, and a middle part of the heat dissipation module is pressed onto the heat dissipation cover 30. Alternatively, the heat dissipation module 40 is directly attached to the heat dissipation cover 30 in a manner such as sticking, welding, or bolting.

Figure 9:
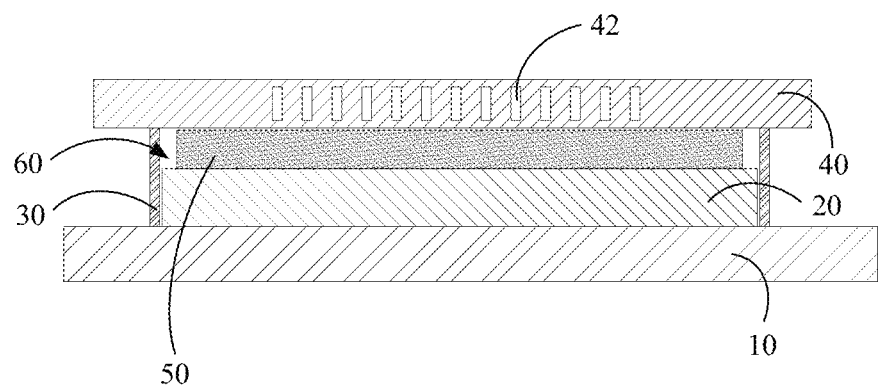
FIG. 9 is a cross-sectional view of a heat dissipation structure of an electronic element according to an embodiment of this application.

FIG. 9 is a cross-sectional view of a heat dissipation structure of an electronic element according to an embodiment of this application. As shown in FIG. 9, the heat dissipation cover may be in a ring shape, and surrounds the electronic element 20 in a structure similar to a dam, the top of the heat dissipation cover 30 is open, and the heat dissipation module 40 covers the opening of the heat dissipation cover 30. The heat dissipation module 40 may be in contact with the melted phase-change thermally conductive material 50 through the opening, so that the phase-change thermally conductive material 50 conducts heat generated by the electronic element 20 to the heat dissipation module 40.

As shown in FIG. 5 to FIG. 8, in an embodiment, an opening 31 is disposed on the top wall, a thermally conductive column 41 protrudes from an outer wall of the heat dissipation module and the thermally conductive column 41 passes through the opening 31 and extends into the accommodation cavity 60.

In this embodiment, the thermally conductive column 41 passes through the opening 31, extends into the accommodation cavity 60, and is in contact with the melted phase-change thermally conductive material 50, to perform heat conduction. After the phase-change thermally conductive material 50 is melted, the phase-change thermally conductive material 50 in a liquid state may be fully wrapped on a bottom wall and a peripheral wall of the thermally conductive column 41, so that the heat dissipation module 40 and the phase-change thermally conductive material 50 have a relatively large contact area for heat exchange, thereby improving heat transfer efficiency. The heat dissipation module 40 is directly in contact with the phase-change thermally conductive material 50 by using the thermally conductive column 41, so that a spacing between the electronic element 20 and the heat dissipation module 40 can be smaller. This reduces a length of a heat transfer path, reduces heat transfer resistance, and facilitates an ultra-thin design of the electronic device.

Optionally, sealing may be performed at an insertion position between the thermally conductive column 41 and the opening 31, or sealing may not be performed. This may be selected according to different application scenarios. For example, in a static use scenario in which the electronic device is a desktop computer, a game console, a television, or the like, a possibility of flowing of the melted phase-change thermally conductive material 50 due to vibration is relatively low. Therefore, sealing may not be performed between the thermally conductive column 41 and the opening 31, thereby reducing manufacturing costs. In a dynamic use scenario in which the electronic device is a notebook computer, a portable game console, a mobile phone, a wearable device, or the like, the melted phase-change thermally conductive material 50 is prone to flow out from the insertion position between the thermally conductive column 41 and the opening 31 due to vibration. Therefore, sealing needs to be performed to prevent leakage.

Figure 11:
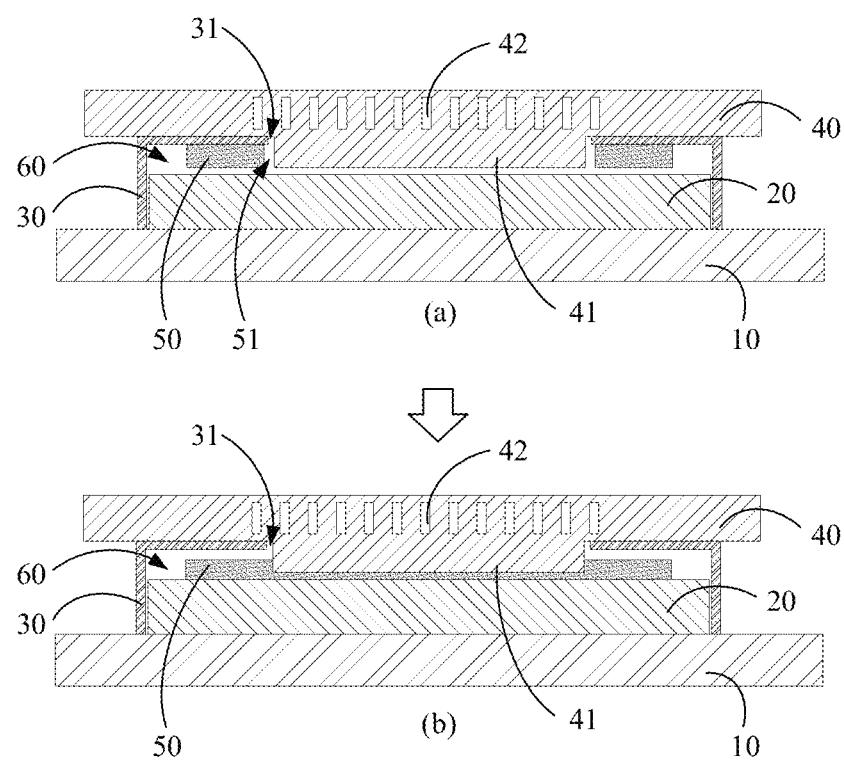
FIG. 11 is a cross-sectional view of another example of a heat dissipation structure of an electronic element according to an embodiment of this application.

FIG. 11 is a cross-sectional view of another example of a heat dissipation structure of an electronic element 20 according to an embodiment of this application. (a) in FIG. 11 is a schematic diagram before the electronic element 20 works, and (b) in FIG. 11 is a schematic diagram in which the phase-change thermally conductive material 50 is melted after the electronic element 20 works. As shown in FIG. 11, optionally, only one thermally conductive column 41 may be disposed, that is, a large round-table structure. In this case, a corresponding opening 31 is a large round hole, and the round table passes through the round hole and extends into the accommodation cavity 60, and is in contact with the melted phase-change thermally conductive material 50. However, this structure is not conducive to improving a contact area between the heat dissipation module 40 and the phase-change thermally conductive material 50, and the large round-table structure increases an overall weight and manufacturing costs of the heat dissipation module 40.

Therefore, to resolve the foregoing problem, as shown in FIG. 5, in an embodiment, there are a plurality of thermally conductive columns 41 spaced from each other, and the plurality of thermally conductive columns 41 pass through a plurality of openings 31 in a one-to-one correspondence and extend into the accommodation cavity 60.

In this embodiment, after the phase-change thermally conductive material 50 is melted, the phase-change thermally conductive material 50 in a liquid state may be fully wrapped on bottom walls and peripheral walls of the plurality of thermally conductive columns 41, so that the heat dissipation module 40 and the phase-change thermally conductive material 50 have a relatively large contact area, and an overall weight and manufacturing costs of the heat dissipation module 40 are reduced.

In an embodiment, the phase-change thermally conductive material 50 is a metal material.

In an embodiment, the phase-change thermally conductive material 50 includes a gallium-based alloy, an indium-based alloy, or a bismuth-based alloy.

In this embodiment, selection of the phase-change thermally conductive material 50 may be the same as or similar to selection of the phase-change thermally conductive material 50 in the foregoing manufacturing method embodiment. Details are not described herein again.

In an embodiment, the heat dissipation cover 30 is a metal cover. The metal may be, for example, a copper-nickel-zinc alloy, an aluminum alloy, or a magnesium alloy.

In addition to preventing leakage of the phase-change thermally conductive material 50 and having a heat dissipation function, in this embodiment, the heat dissipation cover 30 may further support a weight of the heat dissipation module 40, to avoid damage caused by the heat dissipation module 40 to the electronic element 20 on the substrate 10, thereby protecting the electronic element 20. In addition, a closed accommodation cavity 60 is formed by using the heat dissipation cover 30, the substrate 10, and the heat dissipation module 40, and the electronic element 20 is disposed on the substrate 10. The electronic element 20 can be prevented from being exposed to the air, thereby protecting the electronic element 20. In addition, the phase-change thermally conductive material 50 placed in the accommodation cavity 60 is prevented from leaking or reacting with external air or another substance, to avoid affecting normal operation of the electronic device.

Optionally, a shape of the heat dissipation cover 30 is a cube, a circle, or the like. This is not limited in this application.

As shown in FIG. 5, in an embodiment, the heat dissipation module 40 has a heat dissipation fin or heat dissipation grille 42.

In this embodiment, the heat dissipation module 40 includes the heat dissipation fin or heat dissipation grille 42, so that a contact area for heat exchange with the air can be increased.

Optionally, a fan may be added outside of the heat dissipation module 40. An air flow direction of the fan is right against the heat dissipation fin or heat dissipation grille 42, and heat from the electronic element 20 is quickly removed from the heat dissipation module 40 in an air cooling manner.

Optionally, a water cooling mechanism may be further added inside the heat dissipation module 40, to further improve a heat dissipation effect. For example, a circulating pump is added. The heat dissipation module 40 is a hollow structure, an inlet and an outlet are disposed on the heat dissipation module 40, and the circulating pump is connected to the inlet and the outlet by using a pipeline, to inject circulating cooling water into the heat dissipation module 40.

Specifically, the cooling water is closed and circulated in the pipeline, and heat of the heat dissipation module 40 is taken away by the cooling water, and then is emitted to the environment by using the pipeline. Alternatively, the pipeline is connected to an external heat exchanger, heat of the heat dissipation module 40 is taken away by the cooling water and flows into the heat exchanger, and the heat exchanger emits the heat through the air.

Optionally, the heat dissipation module 40 may be metal or non-metal.

Specifically, the heat dissipation module 40 may be connected to a metal support of some functional elements in the electronic device, for example, a metal support part of a battery or a screen, and may conduct heat to the metal support part, and then the metal support part emits the heat to the environment.

Specifically, the heat dissipation module 40 may alternatively be a metal middle frame of the electronic device.

Specifically, some non-metal materials may also have a large thermal conductivity, and have a relatively strong heat conduction capability. For example, the heat dissipation module 40 may alternatively be a non-metal structural component, which is specifically a non-metal structural component made of a graphene material.

Figure 12:
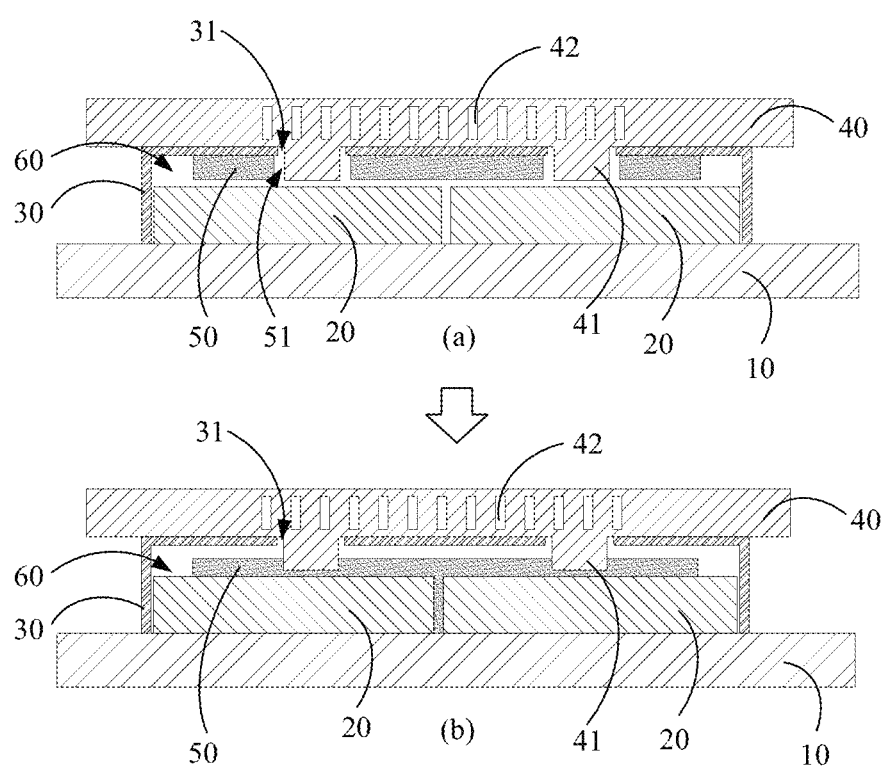
FIG. 12 is a cross-sectional view of another example of a heat dissipation structure of an electronic element according to an embodiment of this application.

FIG. 12 is a cross-sectional view of another example of a heat dissipation structure of an electronic element 20 according to an embodiment of this application. (a) in FIG. 12 is a schematic diagram before the electronic element 20 works, and (b) in FIG. 12 is a schematic diagram in which the phase-change thermally conductive material 50 is melted after the electronic element 20 works.

As shown in FIG. 12, in an embodiment, a plurality of electronic elements 20 are disposed on the substrate 10, and the heat dissipation cover 30 surrounds the plurality of electronic elements 20.

In this embodiment, a single heat dissipation cover 30 may be correspondingly mounted on the outside of the plurality of electronic elements 20, to perform a protection function, a heat dissipation function, and a signal interference prevention function on the plurality of electronic elements 20. A single heat dissipation cover 30 is corresponding to a plurality of electronic elements 20, so that costs of a production process and a mounting process of the heat dissipation cover 30 can be reduced, thereby reducing manufacturing costs of the heat dissipation structure in this application.

In an embodiment, a melting point of the phase-change thermally conductive material is 50~60° C.

Theoretically, a temperature range of a melting point of the phase-change thermally conductive material 50 in this application is relatively large, and may be selected within a temperature range of 35~65° C. However, during actual production and application, it is found that the melting point of the phase-change thermally conductive material 50 should not be too low or too high. A specific reason is as follows: If the melting point is too low, the phase-change thermally conductive material 50 is easy to liquefy and inconvenient to assemble. Therefore, strict temperature control is needed for an assembly environment, and this increases production and manufacturing costs. If the melting point is too high, the phase-change thermally conductive material 50 cannot liquefy easily, and this affects heat conduction. If the electronic element 20 works at a temperature close to the melting point for a long time, functional damage of the electronic element is caused, and a service life of the electronic element is reduced. In conclusion, in this embodiment, a melting point of the phase-change thermally conductive material 50 is 50~60° C.

Figure 13:
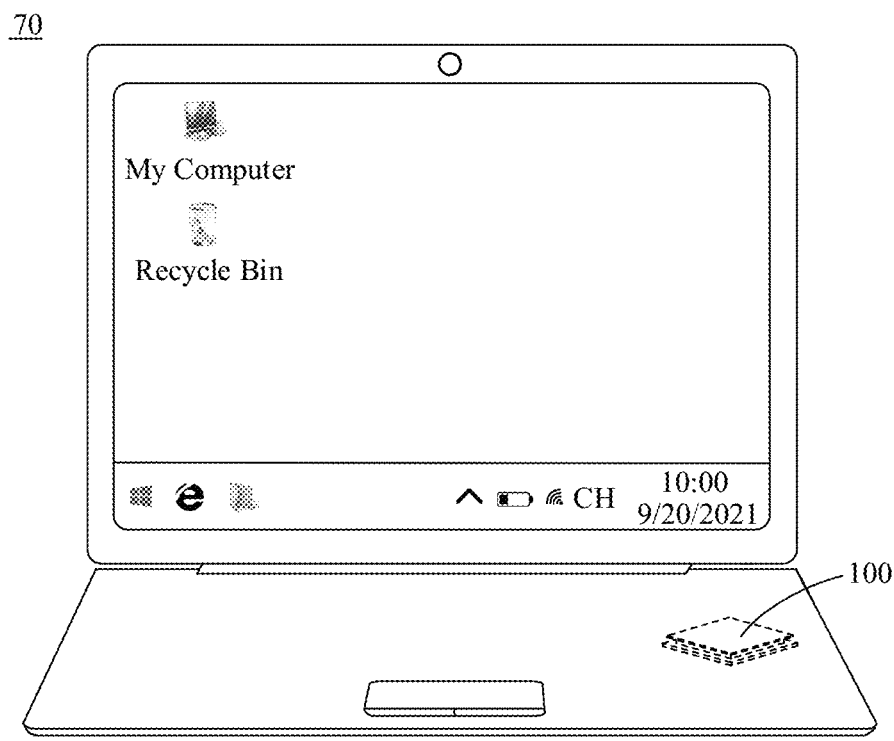
FIG. 13 is a schematic diagram of an electronic device according to an embodiment of this application.

According to a third aspect, this application further provides an electronic device. FIG. 13 is a schematic diagram of an electronic device according to an embodiment of this application. As shown in FIG. 13, the electronic device 70 is a notebook computer, and a heat dissipation structure 100 is disposed inside a body.

In addition, the electronic device 70 may alternatively be any one of a desktop computer, a tablet computer, a game console, a mobile phone, an electronic watch, a router, a set-top box, a television, and a modem.

Optionally, in the electronic device 70 in this application, in addition to applying the foregoing heat dissipation structure 100, a position relationship of the heat dissipation structure 100 in the electronic device 70 may be properly arranged, to further improve a heat dissipation effect of the electronic device 70 and improve heat conduction efficiency of the heat dissipation structure 100. A specific layout design is as follows:

1. An electronic element 20 that is sensitive to the temperature is preferably disposed in a region with a lowest temperature, for example, the bottom of the electronic device 70, and should not be mounted in a position directly above a heating component. A plurality of components are preferably interleaved on a horizontal plane.

2. Heat dissipation of the heat dissipation structure 100 mainly relies on air flow. Therefore, an air flow path should be studied during design, and components such as a fan should be properly configured.

3. Concentration of heating points on the substrate 10 should be avoided, and electronic elements 20 with high power should be evenly distributed on the substrate 10 as far as possible, to ensure even and consistent surface temperature performance of the substrate 10.

4. An electronic element 20 with highest power consumption and most heat is placed near an optimal heat dissipation position in the electronic device 70, for example, near an air outlet position of the fan.

5. If no fan is configured in the electronic device 70, the heat dissipation structure 100 uses a free convection air cooling manner. In this case, electronic elements 20 are arranged in a vertical length manner or a horizontal length manner.

6. Electronic elements 20 on a same substrate 10 should be arranged in different regions as far as possible based on heat amounts and heat dissipation degrees. An electronic element 20 with low heat or poor thermal resistance is placed at the uppermost part of a cooling air flow, and a component with high heat or good thermal resistance (such as a large-scale integrated circuit) is placed at the downmost part of the cooling air flow.

7. In a horizontal direction, a high-power electronic element 20 is disposed as close to the edge of the substrate 10 as possible, to shorten a heat transfer path. In a vertical direction, a high-power electronic element 20 is disposed as close to the top of the substrate 10 as possible, to reduce impact of the component on a temperature of another component during working.

The foregoing descriptions are merely specific implementations of this application. However, the protection scope of this application is not limited thereto. Any change or replacement readily figured out by a person skilled in the art within the technical scope disclosed in this application shall fall within the protection scope of this application. Therefore, the protection scope of this application shall be subject to the protection scope of the claims.

What is claimed is:

1. A heat dissipation structure of an electronic element, comprising:
   a substrate, provided with the electronic element;
   a heat dissipation cover, connected to the substrate and surrounding the electronic element, wherein the heat dissipation cover and the substrate form an accommodation cavity that accommodates the electronic element; and
   a phase-change thermally conductive material, disposed in the accommodation cavity, wherein a melting point of the phase-change thermally conductive material is 35~65° C.;
   the heat dissipation structure further comprises a heat dissipation module attached to a top wall of the heat dissipation cover;
   an opening is disposed on the top wall, a thermally conductive column protrudes from an outer wall of the heat dissipation module, and the thermally conductive column passes through the opening and extends into the accommodation cavity, wherein the phase-change thermally conductive material is configured to melt and wrap itself to a bottom wall and a peripheral wall of the thermally conductive column.

2. The heat dissipation structure according to claim 1, wherein there are a plurality of thermally conductive columns spaced from each other, and the plurality of thermally conductive columns pass through a plurality of openings in a one-to-one correspondence and extend into the accommodation cavity.

3. The heat dissipation structure according to claim 1, wherein the phase-change thermally conductive material is a metal material.

4. The heat dissipation structure according to claim 3, wherein the phase-change thermally conductive material comprises a gallium-based alloy, an indium-based alloy, or a bismuth-based alloy.

5. The heat dissipation structure according to claim 1, wherein the heat dissipation cover is a metal cover.

6. The heat dissipation structure according to claim 1, wherein the heat dissipation module has a heat dissipation fin or a heat dissipation grille.

7. The heat dissipation structure according to claim 1, wherein a plurality of electronic elements are disposed on the substrate, and the heat dissipation cover surrounds the plurality of electronic elements.

8. The heat dissipation structure according to claim 1, wherein a melting point of the phase-change thermally conductive material is 50~60° C.

9. An electronic device, comprising:
a heat dissipation structure, comprising:
a substrate, provided with an electronic element;
a heat dissipation cover, connected to the substrate and surrounding the electronic element, wherein the heat dissipation cover and the substrate form an accommodation cavity that accommodates the electronic element; and
a phase-change thermally conductive material, disposed in the accommodation cavity, wherein a melting point of the phase-change thermally conductive material is 35~65° C.;
the heat dissipation structure further comprises a heat dissipation module attached to a top wall of the heat dissipation cover;
an opening is disposed on the top wall, a thermally conductive column protrudes from an outer wall of the heat dissipation module, and the thermally conductive column passes through the opening and extends into the accommodation cavity, wherein the phase-change thermally conductive material is configured to melt and wrap itself to a bottom wall and a peripheral wall of the thermally conductive column.

10. The electronic device according to claim 9, wherein there are a plurality of thermally conductive columns spaced from each other, and the plurality of thermally conductive columns pass through a plurality of openings in a one-to-one correspondence and extend into the accommodation cavity.

11. The electronic device according to claim 9, wherein the phase-change thermally conductive material is a metal material.

12. The electronic device according to claim 11, wherein the phase-change thermally conductive material comprises a gallium-based alloy, an indium-based alloy, or a bismuth-based alloy.

13. A method for manufacturing a heat dissipation structure of an electronic element, comprising:
placing a substrate having an electronic element in an environment that meets a preset temperature condition; and
in the environment that meets the preset temperature condition, covering a periphery of the electronic element with a heat dissipation cover, fixedly connecting the heat dissipation cover to the substrate, and placing a solid-state phase-change thermally conductive material in an accommodation cavity surrounded by the substrate and the heat dissipation cover;
the covering the periphery of the electronic element with the heat dissipation cover, fixedly connecting the heat dissipation cover to the substrate, and placing the solid-state phase-change thermally conductive material in the accommodation cavity surrounded by the substrate and the heat dissipation cover comprises:
after the phase-change thermally conductive material is constructed into a sheet-like structure, sticking the sheet-like structure to an inner surface of a top wall of the heat dissipation cover, to form an integrated structure, wherein an opening is disposed on the top wall, and wherein an avoidance hole that is aligned with the opening of the top wall is disposed on the sheet-like structure of the phase-change thermally conductive material;
covering the periphery of the electronic element with the integrated structure, and fixedly connecting the integrated structure to the substrate; and
attaching a heat dissipation module to the top wall, and arranging a protruding thermally conductive column on an outer wall of the heat dissipation module to sequentially pass through the opening and the avoidance hole and extend into the accommodation cavity, wherein the phase-change thermally conductive material is configured to melt and wrap itself to a bottom wall and a peripheral wall of the thermally conductive column.

14. The manufacturing method according to claim 13, wherein sticking the sheet-like structure to the inner surface of the top wall of the heat dissipation cover is performed using an adhesive.

15. The manufacturing method according to claim 13, wherein the preset temperature condition is 15~30° C.

16. The manufacturing method according to claim 13, wherein a melting point of the phase-change thermally conductive material is 35~65° C.

17. The manufacturing method according to claim 13, wherein the phase-change thermally conductive material is a metal material.

18. The manufacturing method according to claim 17, wherein the phase-change thermally conductive material comprises a gallium-based alloy, an indium-based alloy, or a bismuth-based alloy.

19. The manufacturing method according to claim 13, wherein the heat dissipation cover is a metal cover.

20. The manufacturing method according to claim 14, wherein the heat dissipation module has a heat dissipation fin or a heat dissipation grille.

* * * * *